United States Patent [19]

Koto et al.

[11] Patent Number: 5,506,321
[45] Date of Patent: Apr. 9, 1996

[54] PHOTOSOLDER RESIST COMPOSITION

[75] Inventors: Hiroyasu Koto; Kiyonori Furuta; Eiko Nakao; Shigeo Nakamura, all of Kanagawa, Japan

[73] Assignee: Ajinomoto Co., Inc., Tokyo, Japan

[21] Appl. No.: 143,058

[22] Filed: Oct. 29, 1993

[30] Foreign Application Priority Data

| Oct. 29, 1992 | [JP] | Japan | 4-291670 |
| Nov. 30, 1992 | [JP] | Japan | 4-319649 |
| Feb. 10, 1993 | [JP] | Japan | 5-022903 |
| Oct. 22, 1993 | [JP] | Japan | 5-286199 |

[51] Int. Cl.$^6$ .................. C08F 224/00; C08F 220/10
[52] U.S. Cl. ........................ 526/273; 526/328.5
[58] Field of Search ................ 526/273, 328.5

[56] References Cited

U.S. PATENT DOCUMENTS

| 4,309,561 | 1/1982 | Huemmer et al. . |
| 4,816,597 | 3/1989 | Snyder, II et al. . |
| 4,943,516 | 7/1990 | Kamayachi et al. ............. 430/280 |

FOREIGN PATENT DOCUMENTS

| 0360579 | 3/1990 | European Pat. Off. . |
| 2350625 | 12/1977 | France . |
| 59-231531 | 12/1984 | Japan . |

OTHER PUBLICATIONS

Database WPI, Derwent Publications Ltd., AN 89–238906, JP–A–1 174 522, Jul. 11, 1989.

*Primary Examiner*—Joseph L. Schofer
*Assistant Examiner*—Wu C. Cheng
*Attorney, Agent, or Firm*—Oblon, Spivak, McClelland, Maier & Neustadt

[57] ABSTRACT

A photosensitive resin composition or photosensitive heat-curing resin composition comprising a photocurable oligomer containing 2 or more polymerizable double bonds and a carboxyl group and a heat-curing component selected from a compound containing one polymerizable double bond and one epoxy group, a compound containing one or more polymerizable double bonds and one or more blocked isocyanate groups; a photosensitive resin composition comprising a photocurable oligomer containing a carboxyl group, a blocked isocyanate group and 2 or more polymerizable double bonds; and a novel compound containing one or more polymerizable double bonds and one or more blocked isocyanate groups are disclosed. The resin compositions have high photosensitivity, excellent developability and provide a solder resist pattern with excellent properties.

2 Claims, 8 Drawing Sheets

PHOTOSOLDER RESIST COMPOSITION

FIELD OF THE INVENTION

This invention relates to a novel photosensitive heat-curing compound containing a blocked isocyanate group or an epoxy group, a photosensitive heat-curing resin composition containing the same, and a photosensitive resin composition comprising a photocurable oligomer containing a blocked isocyanate group. More particularly, it relates to a novel photosolder resist composition for use in the production of printed circuit boards.

BACKGROUND OF THE INVENTION

A solder resist is used in soldering parts to a printed circuit board for prevention of adhesion of the solder to unnecessary parts and for protection of the circuit. It is required to have adhesion to a substrate, electrical insulating properties, resistance to soldering temperatures, solvent resistance, alkali resistance, acid resistance, and resistance to plating.

Epoxy-melamine type heat-curing resins, which were used as solder resists in early years, are unsatisfactory in heat resistance to soldering, chemical resistance, and resistance to plating. Improved epoxy resin type heat-curing solder resists have been proposed for industrial use for the production of printed circuit boards as disclosed in JP-B-51-14044 (the term "JP-B" as used herein means an "examined Japanese patent publication") and are currently widespread. For domestic use where weight is given to productivity, rapid-setting ultraviolet-curable solder resists as disclosed in JP-B-61-48800 are widely employed. However, UV-curing solder resists, when applied thick, show insufficient curing in the inside and also have poor resistance to soldering temperatures and are therefore unsuitable for use in industrial production of printed circuit boards.

On the other hand, with the latest demands for weight and size reduction of electronic parts, printed circuit boards have been increasing the circuit density, and surface mounting of parts on printed circuit boards have been advanced. Under such a situation, while solder resist patterns are generally formed by screen printing, these conventional solder resist compositions when screen printed find difficulty in avoiding bleeding and in sufficiently embedding among circuit pattern lines and can no longer perform their function as a solder resist film.

In order to overcome the above problem, dry film type photosolder resists and liquid photosolder resists have been developed.

Dry film type solder resists include, for example, photosensitive resin compositions containing urethane di(meth)acrylate, a cyclic high polymeric compound having a specific glass transition point, and a sensitizer as disclosed in JP-A-57-55914 (the term "JP-A" as used herein means an "unexamined published Japanese patent application"). However, when applied to a high-density printed circuit board, these dry film type photosolder resists have insufficient heat resistance in soldering and insufficient adhesion.

Known liquid photosolder resists include a photopolymerizable coating composition containing a solid or semisolid reaction product between polyepoxide and an ethylenically unsaturated carboxylic acid, an inert inorganic filler, a photopolymerization initiator, and a volatile organic solvent as disclosed in British Patent (Publication) 2032939A. However, since the composition relies only on a UV-curing component without utilizing heat curing, the resulting resist film is insufficient in adhesion, heat resistance in soldering and electrical insulating properties.

Taking heat curing in combination with UV curing into consideration, JP-B-1-22312 discloses a resin composition for solder resist ink comprising a reaction product between a phenol-novolak epoxy resin and an unsaturated monobasic acid, a partial reaction product between a cresol-novolak epoxy resin and an unsaturated monobasic acid, an organic solvent, a photopolymerization initiator, and an amine type curing agent. In this case, curing is achieved by UV curing in combination with heat curing due to residual epoxy groups in the molecule. However, as the residual epoxy group increases in content, the photosensitive group relatively decreases in content so that the composition has reduced UV curability, and it is difficult to leave a sufficient amount of epoxy groups for satisfying the characteristics demanded as a solder resist. In addition, the use of a halogen type organic solvent for development is unfavorable from the consideration of the working environment.

JP-B-1-54390 discloses a photosolder resist composition capable of development with an alkali aqueous solution which comprises a reaction product among a novolak epoxy resin, an unsaturated monobasic acid and a polybasic acid anhydride, a polyfunctional epoxy resin, a diluent, and a photopolymerization initiator. In this case, too, an increase of the proportion of the epoxy resin for improvement of resist characteristics necessarily leads to a reduction of the photosensitive component, resulting in reduction of photosensitivity. As a result, the coating film is liable to be corroded during development only to provide low resolution. Thus, this technique still fails to satisfy both photosensitivity and other characteristics as a solder resist. Moreover, the composition has poor preservation stability because the epoxy resin gradually undergoes a reaction with the carboxyl groups in the photosensitive oligomer. To avoid this, the composition is usually provided as a two-pack type composition, requiring mixing of two liquids on use.

JP-B-1-54390 discloses a photo- and heat-setting liquid resist ink composition capable of development with a dilute alkali solution which comprises a resin obtained by reacting a reaction product between a novolak epoxy compound and an unsaturated carboxylic acid with a saturated or unsaturated polybasic acid anhydride, a photopolymerization initiator, a diluent, and an epoxy compound having two or more epoxy groups in the molecule. The composition is made alkali-developable by the carboxyl groups of the photosensitive resin. The epoxy groups of the di- or polyfunctional epoxy compound as a heat-curing component undergo copolymerization with free carboxyl groups to contribute to manifestation of various properties as a coating film. However, existence of the di- or polyfunctional epoxy group induces a phenomenon of insufficient development called heat fog. Besides, incorporation of the epoxy compound decreases the proportion of the photosensitive component and thereby reduces photo-curability, which leads to deterioration in sensitivity and resolution.

SUMMARY OF THE INVENTION

An object of the present invention is to provide a photosolder resist composition which is excellent in developability, dry tack-free properties and sensitivity and provides a solder resist pattern having various excellent characteristics.

Another object of the present invention is to provide a novel photosensitive heat-curing compound, a photosensitive heat-curing composition containing the same, and a photosensitive resin composition which are excellent in developability, dry tack-free properties and sensitivity and provide a solder resist pattern having various excellent characteristics.

The present inventors have conducted extensive investigations with the above objects in mind and as a result completed the present invention.

The present invention provides:

(1) a photosolder resist composition essentially comprising (A-1) a photocurable oligomer containing at least two polymerizable double bonds and an acidic functional group, and (B) a compound containing one polymerizable double bond and one epoxy group in the molecule;

(2) a blocked isocyanate group and acrylic group-containing heat-curing compound represented by formula (I):

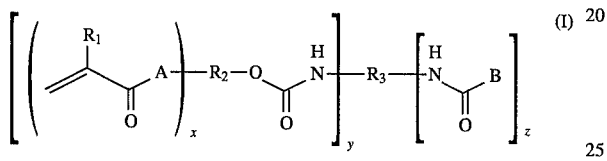

wherein $R_1$ represents a hydrogen atom or a methyl group; $R_2$ represents a $(x+1)$-valent organic group represented by formulae (1) to (5):

$$-\!\!+\!CH_2\!+\!\!_n \quad (1)$$

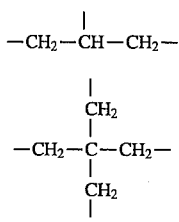

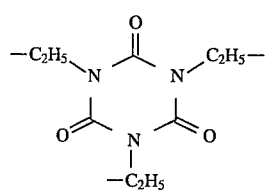

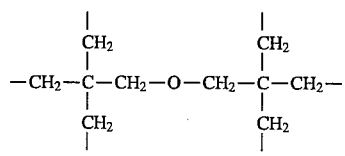

$R_3$ represents a $(y+x)$-valent organic group represented by formulae (6) to (12):

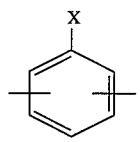

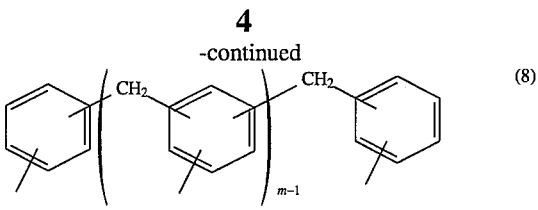

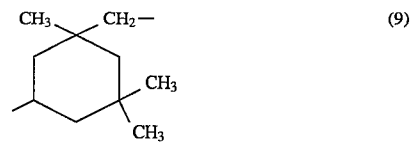

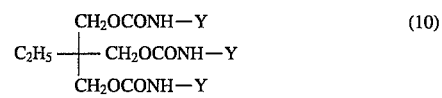

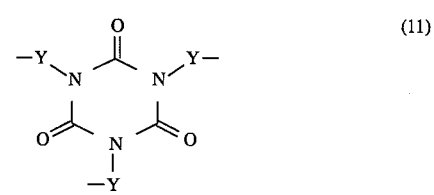

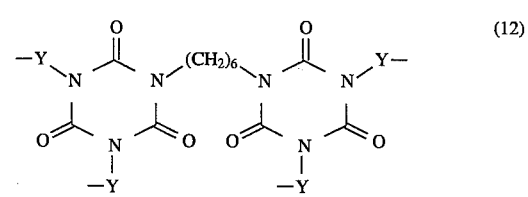

wherein X represents a hydrogen atom or a methyl group; and Y represents a group represented by formula (6) wherein, X is a methyl group, a group represented by formula (7) wherein n represents 6, or a group represented by formula (9); A represents O or NH; B represents a residue of a blocking agent a hydrogen atom of which is removed therefrom; x, y, and z each represents a positive integer; when x is 1, y+z is an integer of 3 or more; when x is 2 or more, y+z is an integer of 2 or more; n represents an integer of 1 to 6; and m represents an integer of 1 to 10;

(3) a photosensitive heat-curing resin composition essentially comprising (A-2) a photocurable oligomer containing at least two polymerizable double bonds in the molecule and (C) a compound containing at least one polymerizable double bond and at least one blocked isocyanate group in the molecule;

(4) a photocurable oligomer comprising a carboxyl group, a blocked isocyanate group, and at least two polymerizable double bonds;

(5) a photosensitive resin composition essentially comprising (A-4) a photocurable oligomer containing a carboxyl group, a blocked isocyanate group and at least two polymerizable double bonds, and (D) a photopolymerization initiator;

(6) a process for producing a photosensitive oligomer containing a carboxyl group, a blocked isocyanate group and at least two polymerizable double bonds, which comprises reacting (1) a hydroxyl group of a photosensitive oligomer containing a carboxyl group, a hydroxyl group, and at least two polymerizable double bonds with (2) an isocyanate group of a compound containing a blocked isocyanate group and an isocyanate group to form a urethane bond; and (7) a photosolder resist composition essentially comprising (A-4) a photocurable oligomer containing a carboxyl group, a blocked isocyanate group and at least two polymerizable double bonds, and (D) a photopolymerization initiator.

DETAILED DESCRIPTION OF THE INVENTION

Figure 1:
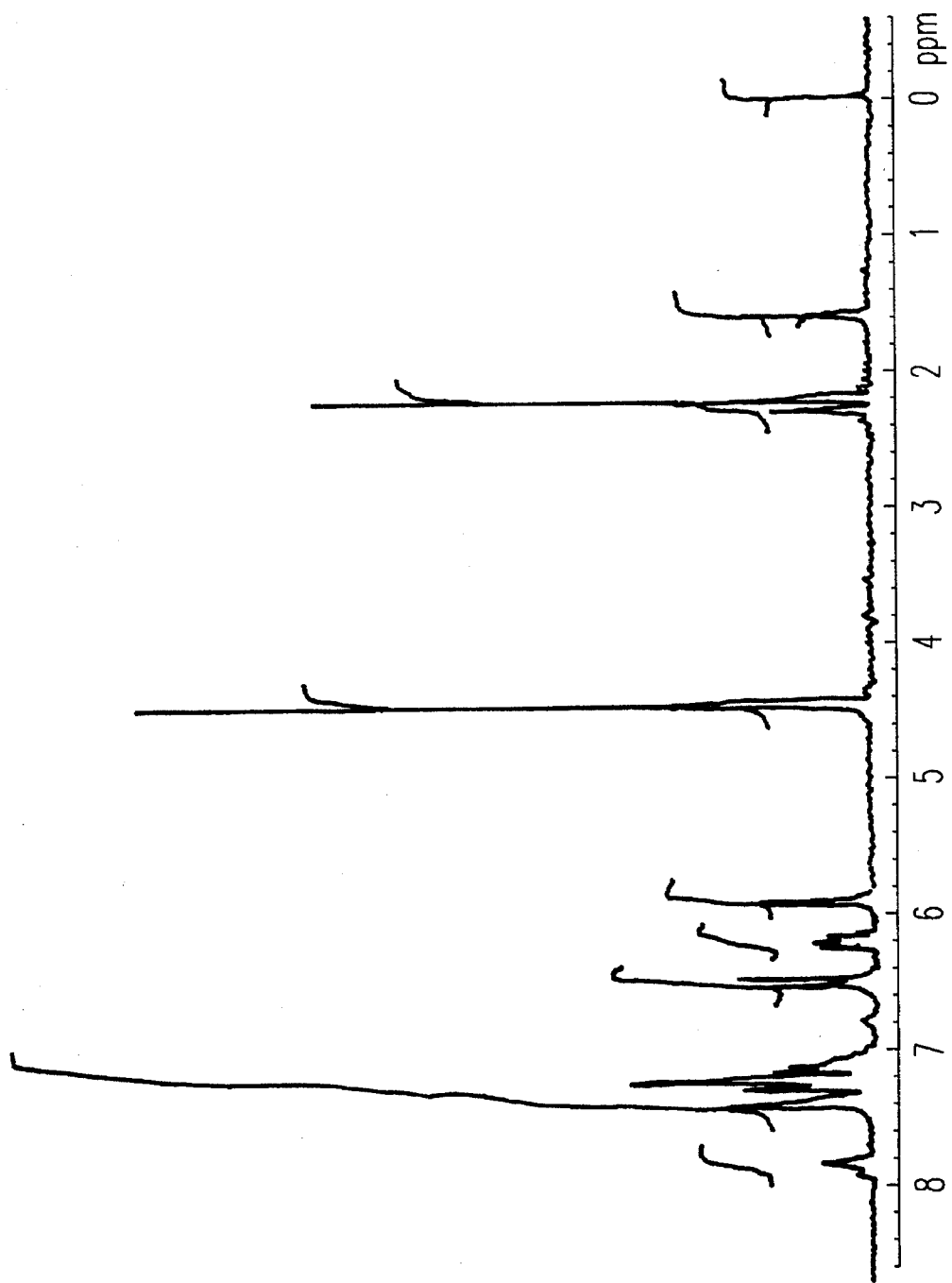
FIG. 1 is the NMR spectrum of the product obtained in Example II-1.

A first embodiment of the present invention relates to a photosolder resist composition essentially comprising (A-1) a photocurable oligomer containing at least two polymerizable double bonds and an acidic functional group and (B) a compound containing one polymerizable double bond and one epoxy group in the molecule.

Photocurable oligomer (A-1) is not particularly limited as long as it contains at least two polymerizable double bonds and an acidic functional group. The polymerizable double bond includes double bonds having various substituents, such as an acrylic group (e.g., (meth)acrylate group or (meth)acrylamide group) and a carboxylic acid vinyl ester, vinyl ether or allyl ether group. Double bonds which are dimerized with light and crosslinked, such as that of a cinnamic ester, are included among the polymerizable double bond as referred to herein. The acidic functional group includes a carboxyl group, a sulfonyl group, etc. Various known photocurable oligomers are among photocurable oligomer (A-1), including a reaction product obtained by reacting a complete and/or partial esterification product between a polyfunctional epoxy resin (e.g., a phenol-novolak epoxy resin or a cresol-novolak epoxy resin) and an unsaturated monocarboxylic acid with a polybasic acid anhydride, and a reaction product between a carboxyl- or carboxylic acid anhydride group-containing polymer (e.g., a styrene-maleic acid anhydride copolymer) and a hydroxyl-containing (meth)acrylate.

In addition, the photocurable oligomer as component (A-1) may be an oligomer containing a carboxyl group, a blocked isocyanate group, and at least two polymerizable double bonds.

The double bond in compound (B) containing one polymerizable double bond and one epoxy group in the molecule includes various double bonds having substituents, such as an acrylic group (e.g., (meth)acrylate group or (meth)acrylamide group) and a carboxylic acid vinyl ester, vinyl ether or allyl ether group. Specific examples of compound (B) are unsaturated fatty acid glycidyl esters, e.g., glycidyl acrylate, glycidyl methacrylate, and glycidyl cinnamate, and commercially available products, e.g., KANEKA RESIN AXE (manufactured by Kanegafuchi Chemical Industry Co., Ltd.), and CYCLOMER A-200 or M-200 (manufactured by Daisel Chemical Industries, Ltd.). A reaction product of a hydroxyalkyl acrylate or a hydroxyalkyl (meth)acrylate, a polycarboxylic acid anhydride, and an epihalohydrin described in JP-A-50-59315 may also be used as compound (B). These compounds may be used either individually or in combination thereof.

In the first embodiment of the present invention, a weight ratio of photocurable oligomer (A-1)/compound (B) used is preferably 100/10 to 100/150 and more preferably 100/15 to 100/80.

A second embodiment of the present invention relates to a photosensitive heat-curing resin composition essentially comprising (A-2) a photocurable oligomer containing at least two polymerizable double bonds and (C) a compound containing at least one polymerizable double bond and at least one blocked isocyanate group in the molecule; and a novel blocked isocyanate group-containing photosensitive heat-curing compound which is useful as component (C).

In the second embodiment of the present invention, a weight ratio of photocurable oligomer (A-1)/compound (C) used is preferably 100/10 to 100/150 and more preferably 100/30 to 100/100.

The novel blocked isocyanate group-containing photosensitive heat-curing compound according to the present invention is represented by formula (I) as defined above.

Photocurable oligomer (A-2) containing at least two polymerizable double bonds is not particularly limited. The polymerizable double bond includes various double bonds having substituents, such as an acrylic group (e.g., (meth)acrylate group or (meth)acrylamide group) and a carboxylic acid vinyl ester, vinyl ether or allyl ether group. Double bonds which are dimerized with light and crosslinked, such as that of a cinnamic ester, are included in the polymerizable double bond as referred to herein. A preferred polymerizable double bond is an acrylic group. Various known photocurable oligomers are among photocurable oligomer (A-2), including a reaction product obtained by reacting a complete and/or partial esterification product between a polyfunctional epoxy resin (e.g., a phenol-novolak epoxy resin or a cresol-novolak epoxy resin) and an unsaturated monocarboxylic acid with a polybasic acid anhydride, and a reaction product between a carboxyl- or carboxylic acid anhydride group-containing polymer (e.g., a styrene-maleic acid anhydride copolymer) and a hydroxyl-containing (meth)acrylate.

The double bond in compound (C) containing at least one polymerizable double bond and at least one blocked isocyanate group in the molecule includes various double bonds having substituents, such as an acrylic group (e.g., (meth)acrylate group or (meth)acrylamide group) and a carboxylic acid vinyl ester, vinyl ether or allyl ether group. Double bonds which are dimerized with light and crosslinked, such as that of a cinnamic ester, are included under the polymerizable double bond as referred to herein. A preferred polymerizable double bond is an acrylic group.

The blocking agent of the blocked isocyanate group are known blocking agents capable of regenerating an isocyanate group on heating, such as phenols, e.g., phenol and cresol; oxime compounds, e.g., methyl ethyl ketoxime, acetoxime, and cyclohexanone oxime; lactam compounds, e.g., $\epsilon$-caprolactam, $\gamma$-butyrolactam, and $\beta$-propiolactam; active methylene compounds, e.g., ethyl acetoacetate, diethyl malonate, and acetylacetone; amine compounds, e.g., aniline and diphenylamine; imidazole compounds, e.g., imidazole and benzimidazole; azole compounds, e.g., benzotriazole; and imide compounds, e.g., N-hydroxyimide and phthalimide. Compound (C) containing at least one polymerizable double bond and at least one blocked isocyanate group in the molecule includes various compound known by literature, the novel blocked isocyanate group and acrylic group-containing photosensitive heat-curing compounds represented by formula (I), and mixtures thereof. Specific examples of the known compounds include blocked (meth-)acryloyl isocyanate, blocked isocyanatoethyl (meth)acrylate, and a reaction product of tolylene diisocyanate, 2-hydroxyethyl (meth)acrylate, and a blocking agent. The novel blocked isocyanate group and acrylic group-containing photosensitive heat-curing compound of formula (I) is a reaction product or a reaction mixture obtained by reacting (1) a polyisocyanate compound, e.g., tolylene diisocyanate, hexamethylene diisocyanate, isophorone diisocyanate, a trimer of these diisocyanate compounds, methylene-bis-(4-phenyl isocyanate), or polymethylene polyphenyl polyisocyanate, (2) a (meth)acrylate compound containing a functional group capable of reacting with an isocyanate group typically exemplified by a hydroxyl group, e.g., 2-hydroxyethyl (meth)acrylate, N-methylolacrylamide, pentaerythritol tri(meth)acrylate, dipentaerythritol penta(meth)acrylate or bis-((meth)acryloxyethyl)-hydroxyethyl isocyanurate, and (3) a blocking agent. The reaction can be carried out by known processes (e.g., methods described in Farkas: J. Ame. Chem. Soc., 82, 642 (1960) and Cox and Hastettler, Ind. Eng. Chem., 52, 609 (1960)), for example, in an organic solvent, e.g., toluene or ethyl acetate, at a temperature of from 40° to 100° C. in the presence of a tertiary amine, an organotin compound, etc., as a catalyst.

A third embodiment of the present invention relates to a photosensitive resin composition essentially comprising (A-4) a photocurable oligomer containing a carboxyl group, a blocked isocyanate group and at least two polymerizable double bonds, and (D) a photopolymerization initiator, and to a process for preparing photocurable oligomer (A-4).

The third embodiment is characterized by using photocurable oligomer (A-4) containing a carboxyl group, a blocked isocyanate group, and at least two polymerizable double bonds. This oligomer possesses by itself photosensitivity, heat curability, and developability. The composition containing photocurable oligomer (A-4) suffers from neither the problem of preservation instability as encountered with the conventional solder resists which are mixed with a heat-curing resin on use nor the problem of reduction in sensitivity which is caused by addition of a heat-curing component having no photo-curability.

The polymerizable double bonds in photocurable oligomer (A-4) include double bonds having various substituents, such as an acrylic group (e.g., (meth)acrylate group or (meth)acrylamide group) and a carboxylic acid vinyl ester, vinyl ether or allyl ether group. A preferred polymerizable double bond is an acrylic group. The blocked isocyanate group in photocurable oligomer (A-4) is an isocyanate group having added thereto a blocking agent which is released on application of heat. The blocking agent of the blocked isocyanate group includes known blocking agents capable of regenerating an isocyanate group on heating, such as phenols, e.g., phenol and cresol; oxime compounds, e.g., methyl ethyl ketoxime, acetoxime, and cyclohexanone oxime; lactam compounds, e.g., ε-caprolactam, γ-butyrolactam, and β-propiolactam; active methylene compounds, e.g., ethyl acetoacetate, diethyl malonate, and acetylacetone; amine compounds, e.g., aniline and diphenylamine; imidazole compounds, e.g., imidazole and benzimidazole; azole compounds, e.g., benzotriazole; and imide compounds, e.g., N-hydroxyimide and phthalimide.

Photocurable oligomer (A-4) according to the third embodiment can be prepared by reacting (1) an oligomer containing a carboxyl group, a hydroxyl group, and at least two polymerizable double bonds with (2) a compound containing an isocyanate group and a blocked isocyanate group.

Specific examples of the oligomer containing a carboxyl group, a hydroxyl group, and at least two polymerizable double bonds include a reaction product of a polyfunctional epoxy resin (e.g., a phenol-novolak epoxy resin, a cresol-novolak epoxy resin, or a homo- or copolymer of glycidyl methacrylate), an unsaturated carboxylic acid, and a polybasic acid anhydride. The unsaturated carboxylic acid includes acrylic acid, methacrylic acid, crotonic acid, and cinnamic acid, with acrylic acid being preferred. The typical examples of the polybasic acid anhydride includes maleic acid anhydride, succinic acid anhydride, itaconic acid anhydride, phthalic acid anhydride, tetrahydrophthalic acid anhydride, methylhexahydrophthalic acid anhydride, endomethylenetetrahydrophthalic acid anhydride, methyl-endomethylenetetrahydrophthalic acid anhydride, and trimellitic acid anhydride. Additionally, other photosensitive oligomers which are known for alkali-developable solder resists and contain a hydroxyl group, such as a reaction product between a carboxyl-containing oligomer and glycidyl (meth)acrylate, may also be used as the starting oligomer for obtaining photocurable oligomer (A-4).

The compound containing an isocyanate group and a blocked isocyanate group can be prepared by reacting the above-described blocking agent on a part of the isocyanate groups of a polyfunctional isocyanate compound. The polyfunctional isocyanate compound which can be used includes known compounds, such as tolylene diisocyanate, hexamethylene diisocyanate, a trimer of these diisocyanate compounds, isophorone diisocyanate, methylene-bis-(4-phenyl isocyanate), and polymethylene polyphenyl polyisocyanate. The reaction is carried out under conditions similar to those adopted in the preparation of general blocked isocyanate compounds. The blocking agent is preferably used in an amount of from 0.1 to 0.8 equivalent per the isocyanate equivalent of the polyfunctional isocyanate compound. If the amount of the blocking agent is less than 0.1 equivalent, the oligomer obtained by using the resulting blocked isocyanate compound is short of heat-crosslinkable groups, failing to produce full effects of the present invention. If the amount of the blocking agent is more than 0.8 equivalent, the resulting blocked isocyanate compound is short of isocyanate groups capable of reacting with the oligomer. A particularly preferred amount of the blocking agent ranges from 0.3 to 0.7 equivalent.

Photocurable oligomer (A-4) can be prepared by mixing the above-mentioned oligomer containing a carboxyl group, a hydroxyl group, and at least two polymerizable double bonds and the above-mentioned compound containing an isocyanate group and a blocked isocyanate group to induce a urethanation reaction. The reaction can be carried out with or without a solvent. Suitable solvents include those having no active hydrogen reactive with an isocyanate group, such as hydrocarbons, ethers, and esters. Photosensitive monomers which are used as a reactive diluent for general photosensitive resins may also serve as a solvent. As a catalyst of a urethanation reaction, dibutyltin dilaurate, tertiary amines, etc., may be added to accelerate the reaction. Further, a polymerization inhibitor for preventing the oligomer from polymerizing during the reaction may also be added to the reaction system. The reaction is preferably conducted at a temperature of from 0° to 250° C., and more preferably from 30° to 180° C. The oligomer containing a carboxyl group, a hydroxyl group and at least two polymerizable double bonds and the compound containing an isocyanate group and a blocked isocyanate group are preferably used at such a ratio that the amount of non-blocked isocyanate groups in the latter is 0.01 to 0.8 equivalent to the active hydrogen of the hydroxyl groups, carboxyl groups, etc. in the former. If the amount of the compound containing an isocyanate group and a blocked isocyanate group is less than 0.01 equivalent, the effects of the present invention cannot be produced sufficiently. If it is more than 0.8 equivalent, the resulting photocurable oligomer has too high a viscosity or deteriorated developability.

Photopolymerization initiator (D) which can be used in the photosensitive resin composition of the third embodiment will be described later.

The compositions according to the present invention may further contain known photopolymerization initiators, diluents, heat-curing resins, epoxy resin curing agents, inorganic fillers, colorants, and other compounding additives.

The photopolymerization initiators which can be used in the present invention include benzoins, e.g., benzoin and benzil; benzoin alkyl ethers, e.g., benzoin methyl ether, and benzoin isopropyl ether; acetophenones, e.g., acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl-1-[4-(methylthio)phenyl]-2-morphono-propan-1-one, and N,N-dimethylaminoacetophenone; anthraquinones, e.g., 2-methylanthraquinone, 2-ethylanthraquinone, 2-t-butylanthraquinone, 1-chloroanthraquinone, 2-amylanthraquinone, and 2-aminoanthraquinone; thioxanthones, e.g., 2,4-dimethylthioxanthone, 2,4-diethylthioxanthone, 2-chlorothioxanthone, and 2,4-diisipropylthioxanthone; ketals, e.g., acetophenone dimethyl ketal and benzyl dimethyl ketal; benzophenones, e.g., benzophenone, methylbenzophenone, 4,4'-dichlorobenzophenone, 4,4'-bisdiethylaminobenzophenone, and Michler's ketone; and xanthones. These photopolymerization initiators may be used either individually or in combination of two or more thereof. These photopolymerization initiators may be used in combination with one or more of known photosensitizers, such as benzoic esters (e.g., ethyl 4-dimethylaminobenzoate and 2-(dimethylamino)ethyl benzoate) and tertiary amines (e.g., triethylamine and triethanolamine).

While a photopolymerization initiator is not necessary in cases where the polymerizable double bond in a photocurable oligomer component produces a reaction by itself on exposure to light as in the case of the double bond of a cinnamic acid compound, it is preferably added in the case where a photocurable oligomer has an acrylic group. A suitable amount of the photopolymerization initiator to be added is in the range of from 0.2 to 30 parts, and preferably from 2 to 20 parts, by weight per 100 parts by weight of photocurable oligomer component. When the amount is less than 0.2 part, sensitivity is insufficient. When the amount is more than 30 parts, no further increase in sensitivity is expected.

Diluents may be added to the composition for the purpose of dissolving the photocurable oligomer component and thereby making the composition liquid ready to be coated and providing a film on drying. Such diluents include photopolymerizable vinyl monomers and/or organic solvents. Typical examples of photopolymerizable vinyl monomers include hydroxyalkyl acrylates, e.g., 2-hydroxyethyl acrylate and 2-hydroxybutyl acrylate; mono- or diacrylates of glycols (e.g., ethylene glycol, methoxytetraethylene glycol, polyethylene glycol, and propylene glycol); acrylamides, e.g., N,N-dimethylacrylamide and N-methylolacrylamide; aminoalkyl acrylates, e.g., N,N-dimethylaminoethyl acrylate; polyacrylates of polyhydric alcohols (e.g., trimethylolpropane, pentaerythritol, and dipentaerythritol) or ethylene oxide, propylene oxide or ε-caprolactone adducts thereof; phenols compounds, e.g., phenoxy acrylate or phenoxyethyl acrylate, or ethylene oxide or propylene oxide adducts thereof; epoxy acrylates derived from glycidyl ethers (e.g., trimethylolpropane triglycidyl ether); melamine acrylates; and/or methacrylates corresponding to these acrylates.

Typical examples of organic solvents which can be used in the compositions of the present invention include ketones, e.g., methyl ethyl ketone; aromatic hydrocarbons, e.g., toluene and tetramethylbenzene; glycol ethers, e.g., methyl cellosolve, methyl carbitol, and triethylene glycol monoethyl ether; esters, e.g., ethyl acetate and acetic esters of the above-mentioned glycol ethers; alcohols, e.g., ethylene glycol and propylene glycol; aliphatic hydrocarbons, e.g., octane; and petroleum solvents, e.g., petroleum naphtha and solvent naphtha.

These diluent are used either individually or in combination of two or more thereof. The diluent is used in an amount of preferably from 10 to 250 parts, and more preferably from 30 to 200 parts, by weight per 100 parts by weight of the photocurable oligomer component. According to the type of the diluent used, the system for exposing the coated composition to light is selected from a contact system using a photomask in contact with the coating film and a non-contact system using a photomask out of contact with the coating film.

The inorganic fillers which may be added to the composition of the present invention include those commonly employed, such as barium sulfate, barium titanate, silicon oxide powder, silicon oxide fine powder, amorphous silica, talc, clay, magnesium carbonate, calcium carbonate, aluminum oxide, aluminum hydroxide, and mica. The inorganic filler is used in an amount of generally up to 100% by weight, and preferably from 5 to 60% by weight, based on the resin composition.

Examples of colorants which may be added to the composition of the present invention include Phthalocyanine Blue, Phthalocyanine Green, Iodine Green, Disazo Yellow, Crystal Violet, titanium oxide, carbon black, and naphthalene black.

If desired, the composition of the present invention may further contain other commonly employed additives, such as thermal polymerization inhibitors, e.g., hydroquinone, hydroquinone monomethyl ether, and phenothiazine; thickeners, e.g., asbestos, and Bentonite; and anti-foaming agents and/or levelling agents, e.g., silicon types, fluorine types and high polymer types; and adhesion-imparting agents, e.g., imidazole compounds, thiazole compounds, triazole compounds, and silane coupling agents.

Examples of heat-curing resins which, if desired, may be further added to the composition of the present invention include epoxy resins, melamine resins, phenol resins, and polyurethane resins. These heat-curing resins may be added in combination with a curing agent therefor.

Epoxy curing agents known for photosolder resists can be used in the compositions of the present invention. Suitable epoxy curing agents include dicyandiamide or its modified compounds, amine compounds, imidazole compounds, polybasic acid hydrazides, carboxylic acid compounds, phenols, quaternary ammonium salts, amino resins, and epoxy adducts thereof. Since these curing agents function not only as a curing agent for an epoxy resin but as an accelerator for crosslinking of a blocked isocyanate compound, addition of the epoxy curing agent to some of the compositions of the present invention is effective to improve physical properties even if the composition contains no epoxy resin.

The developer which can be used for removal of the unexposed area includes an organic solvent and/or an alkali aqueous solution. Examples of suitable organic solvents as a developer include cyclohexanone, xylene, tetramethylbenzene, butyl cellosolve, butyl carbitol, propylene glycol monomethyl ether, Cellosolve acetate, propanol, propylene glycol, trichloroethane, trichloroethylene, modified trichloroethane (e.g., "ETHANA IR" produced by Asahi Chemical Industry Co., Ltd., "THREE-ONE EX-R" produced by Toa Gosei Chemical Industry Co., Ltd., "KANDEN TRIETHANE SR-A" produced by Kanto Denka Kogyo Co., Ltd., and "RESISOLVE V-5" produced by Asahi Glass Co., Ltd.). Examples of suitable alkalis include potassium hydroxide, sodium hydroxide, sodium carbonate, potassium carbonate, sodium phosphate, sodium silicate, ammonia, and amines.

According to the first embodiment of the present invention, since compound (B) containing one polymerizable double bond and one epoxy group in the molecule and photocurable oligomer (A-1) undergo mutual crosslinking on exposure to light, the composition exhibits improved photosensitivity to form a coating film which is hardly corroded with a developer and thereby provides a resist pattern with improved sharpness as compared with a composition having merely incorporated thereto only an epoxy resin as in Comparative Example I-2 hereinafter described. Further, upon heating after development, the epoxy group undergoes polymerization, or the epoxy group and the carboxyl group in photocurable oligomer (A-1) form a bond, whereby the crosslinking reaction proceeds to form a solder resist pattern for a printed circuit board with various excellent characteristics as desired.

The compounds and compositions according to the present invention are particularly useful as a solder resist composition. They are also applicable as-insulating compounds, impregnating compounds, surface covering materials, paints, adhesives, and so forth.

The present invention will now be illustrated in greater detail with reference to Preparation Examples, Examples, and Comparative Examples, but the present invention should not be construed as being limited thereto. All the percents and parts are given by weight unless otherwise indicated.

PREPARATION EXAMPLE I-1

In a three-necked flask equipped with a stirrer and a condenser were charged 107 parts of a cresol-novolak epoxy resin having an epoxy equivalent of 214 ("EPICLON N-680" produced by Dainippon Ink Co., Ltd.), 62 parts of carbitol acetate, and 30 parts of solvent naphtha. The mixture was melted by heating to 90° C. while stirring. To the molten mixture were added 40 parts of acrylic acid, 0.1 part of hydroquinone, and 0.68 part of dimethylbenzylamine, and the mixture was stirred at 110° C. for 24 hours. After cooling to 100° C., 37 parts of tetrahydrophthalic acid anhydride was added to the reaction mixture, followed by stirring for 4 hours to obtain a photocurable oligomer solution having an acid value of 50 mg-KOH/g (hereinafter designated Resin a-1).

| | |
|---|---|
| Resin a-1 | 60 parts |
| Dipentaerythritol hexaacrylate | 5 parts |
| IRGACURE 907 (photopolymerization initiator produced by CIBA Geigy) | 5 parts |
| Glycidyl methacrylate | 35 parts |
| Dicyandiamide | 1 part |
| Barium sulfate | 30 parts |
| Phthalocyanine Green | 1 part |
| Flowlen AC-326F (anti-foaming agent produced by Kyoeisha Chemical Co., Ltd.) | 2 parts |
| Carbitol acetate | 3 parts |
| Solvent naphtha | 1 part |

The above components were preliminarily mixed and then kneaded three times in a three-roll mill to prepare a photosensitive heat-curing resin composition. The composition was screen-printed on the entire surface of a printed circuit board and dried in a circulating hot air oven at 80° C. for 20 minutes followed by cooling to room temperature to obtain a dried film. The film was exposed to light of a metal halide lamp (manufactured by Oak Seisakusho) through a patterned photomask in contact with the film. The exposed film was developed with a 1% sodium carbonate aqueous solution for 1 minute to remove the unexposed area, washed with water, and postcured in a circulating hot air oven set at 150° C. for 30 minutes to form a solder resist pattern.

EXAMPLE I-2

| | |
|---|---|
| Resin a-1 | 60 parts |
| Dipentaerythritol hexaacrylate | 5 parts |
| IRGACURE 907 | 5 parts |
| KANEKA RESIN AXE (produced by Kanegafuchi Chemical Ind. Co., Ltd.) | 35 parts |
| Dicyandiamide | 1 part |
| Barium sulfate | 30 parts |
| Phthalocyanine Green | 2 parts |
| Flowlen AC-326F | 2 parts |
| Carbitol acetate | 3 parts |
| Solvent naphtha | 1 part |

A solder resist pattern was formed on a printed circuit board in the same manner as in Example I-1, except for using the above components.

EXAMPLE I-3

| | |
|---|---|
| Resin a-1 | 60 parts |
| Dipentaerythritol hexaacrylate | 5 parts |
| IRGACURE 907 | 5 parts |
| CYCLONER A-200 (produced by Daisel Chemical Industries, Ltd.) | 35 parts |
| Dicyandiamide | 1 part |
| Barium sulfate | 30 parts |
| Phthalocyanine Green | 2 parts |
| Flowlen AC-326F | 2 parts |
| Carbitol acetate | 3 parts |
| Solvent naphtha | 1 part |

A solder resist pattern was formed on a printed circuit board in the same manner as in Example I-1, except for using the above components.

COMPARATIVE EXAMPLE I-1

| | |
|---|---|
| Resin a-1 | 60 parts |
| Dipentaerythritol hexaacrylate | 5 parts |
| IRGACURE 907 | 5 parts |

-continued

| Barium sulfate | 20 parts |
| Phthalocyanine Green | 2 parts |
| Flowlen AC-326F | 2 parts |
| Carbitol acetate | 3 parts |
| Solvent naphtha | 1 part |

A solder resist pattern was formed on a printed circuit board in the same manner as in Example I-1, except for using the above components.

COMPARATIVE EXAMPLE I-2

| Resin a-1 | 60 parts |
| Dipentaerythritol hexaacrylate | 5 parts |
| IRGACURE 907 | 5 parts |
| Epikote 157 (epoxy resin produced by Yuka Shell Epoxy Co., Ltd.) | 35 parts |
| Dicyandiamide | 2 parts |
| Barium sulfate | 30 parts |
| Phthalocyanine Green | 2 parts |
| Flowlen AC-326F | 2 parts |
| Carbitol acetate | 3 parts |
| Solvent naphtha | 1 part |

A solder resist pattern was formed on a printed circuit board in the same manner as in Example I-1, except for using the above components. The resin compositions and solder resist patterns obtained in Examples I-1 to I-4 and Comparative Examples I-1 and I-2 were tested for various characteristics in accordance with the following test methods. The results obtained are shown in Table I-1 below.

1) Photosensitivity

The printed and dried film was exposed to ultraviolet light adjusted to 100 mJ/cm$^2$ with an integrating actinometer (manufactured by Oak Seisakusho) through "Step Tablet 21" (produced by Stouffer Co.) as a photomask, developed with the developer, and washed with water. The highest number of the step corresponding to the area which remained intact from the attack of the developer was taken as a measure of photosensitivity.

2) Developability

The printed and dried film was exposed to 500 mJ/cm$^2$ of ultraviolet light through a photomask. The exposed sample was immersed in the developer for 1 minute with stirring, and the state of removal of the unexposed area was observed with the naked eye and evaluated according to the following standard.

Excellent—The unexposed area was removed completely.

Good—Thin undeveloped film remained on some areas.

Poor—Non-development of the unexposed area was observed all over the surface.

Very poor—The unexposed area substantially remained undeveloped.

3) Adhesion

The printed and dried film was exposed to ultraviolet light adjusted to 500 mJ/cm$^2$ with an integrating actinometer (manufactured by Oak Seisakusho) through a photomask, and the exposed film was immersed in the developer for 1 minute with stirring. The developed film was postcured at 150° C. for minutes to obtain a test piece. The test piece was crosscut and subjected to peel test using cellophane tape in accordance with JIS D0202. The adhesion of the film was evaluated from the number of squares remaining on the substrate per 100 squares according to the following standard.

Excellent—100/100

Good—100/100 (provided that the crosscut portion was slightly peeled off)

Medium—50/100 to 99/100

Poor—0/100 to 49/100

4) Pencil Hardness

Film hardness of the same test piece as prepared in above was measured according to JIS K5400.

5) Resistance to Soldering

In accordance with JIS C6481, the same test piece as prepared in 3) was dipped in a soldering bath at 260° C. for 15 seconds three times. The state of the resist film was observed and evaluated as a whole according to the following standard.

Excellent—No change was observed at all.

Good—Substantially no change was observed.

Poor—Remarkable change was observed.

Very poor—Blistering or falling of the film due to blisters was observed.

6) Resistance to Nickel Plating

The test piece as prepared in 3) was plated with an electroless nickel plating solution "ICP Nicoron" (produced by Okuno Chemical Industries Co., Ltd.) at a bath temperature of 85° C. for 30 minutes. The state of the resist film was evaluated according to the same standard as in 5) above.

7) Insulation Resistance

A test piece was prepared by using a G-10 comb type test pattern specified in JIS Z3197 under the same conditions as in the adhesion test. A voltage of 100 V was applied for 1 minute to the test piece immediately after the preparation (original state) or after being boiled for 2 hours, and then the insulation resistance was measured.

TABLE I-1

| | Example I-1 | Example I-2 | Example I-3 | Compar. Example I-1 | Compar. Example I-2 |
|---|---|---|---|---|---|
| Photosensitivity | 7 | 8 | 9 | 5 | 4 |
| Developability | excellent | excellent | excellent | excellent | poor |
| Adhesion | excellent | excellent | excellent | excellent | excellent |
| Pencil Hardness | 4H | 4H | 4H | 4H | 4H |
| Resistance to Soldering | good | good | good | poor | good |
| Resistance to Ni plating | good | good | good | very poor | good |
| Insulation Resistance ($\Omega$): | | | | | |
| Original state | $2 \times 10^{14}$ | $2 \times 10^{14}$ | $2 \times 10^{14}$ | $3 \times 10^{14}$ | $3 \times 10^{14}$ |
| After boiling | $8 \times 10^{11}$ | $6 \times 10^{12}$ | $3 \times 10^{12}$ | $2 \times 10^{11}$ | $6 \times 10^{12}$ |

As is apparent from the results of Table I-1, the photosolder resist composition according to the present invention has high photosensitivity and excellent developability and provides a solder resist pattern with excellent characteristics, such as adhesion to a substrate, hardness, heat resistance in soldering, and plating resistance. To the contrary, the comparative photosolder resist composition containing a photocurable oligomer as a sole curing component (Comparative Example I-1) or a combination of a photocurable oligomer and a heat-curing component (Comparative Example I-2) has difficulty in obtaining photosensitivity and developability before curing as well as various characteristics after curing.

As demonstrated above, the photosolder resist composition essentially comprising (A-1) a photocurable oligomer containing at least two polymerizable double bonds and an acidic functional group and (B) a compound containing one polymerizable double bond and one epoxy group in the molecule according to the present invention exhibits high photosensitivity and excellent developability to form a solder resist pattern excellent in adhesion, electrical insulating properties, soldering heat resistance, and plating resistance.

EXAMPLE II-1

Figure 2:
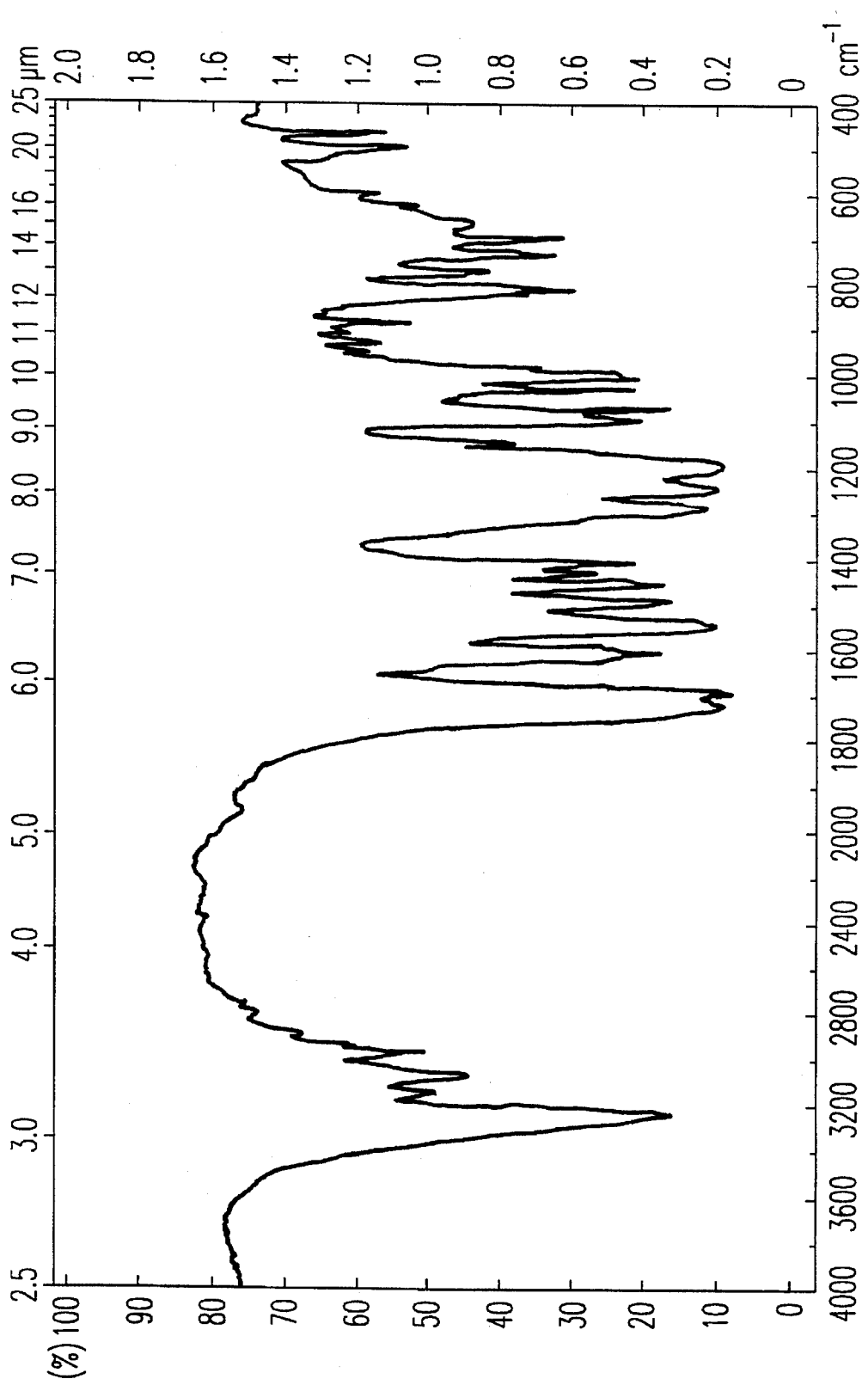
FIG. 2 is the IR spectrum of the product obtained in Example II-1.

In a three-necked flask equipped with a stirrer and a condenser were charged 100 parts of 2,4-tolylene diisocyanate, 50 parts of toluene, 53 parts of phenol and 0.2 part of dibutyltin dilaurate, and the mixture was heated at 60° C. for 1.5 hours while stirring. To the mixture was added 66 parts of 2-hydroxyethyl acrylate at that temperature, and a reaction was conducted for 7 hours. After completion of the reaction, the solvent was removed by distillation to obtain a product (designated Compound A). The NMR spectrum (in chloroform-d) and IR spectrum (KBr tablet method) of Compound A are shown in FIGS. 1 and 2, respectively.

EXAMPLE II-2

Figure 3:
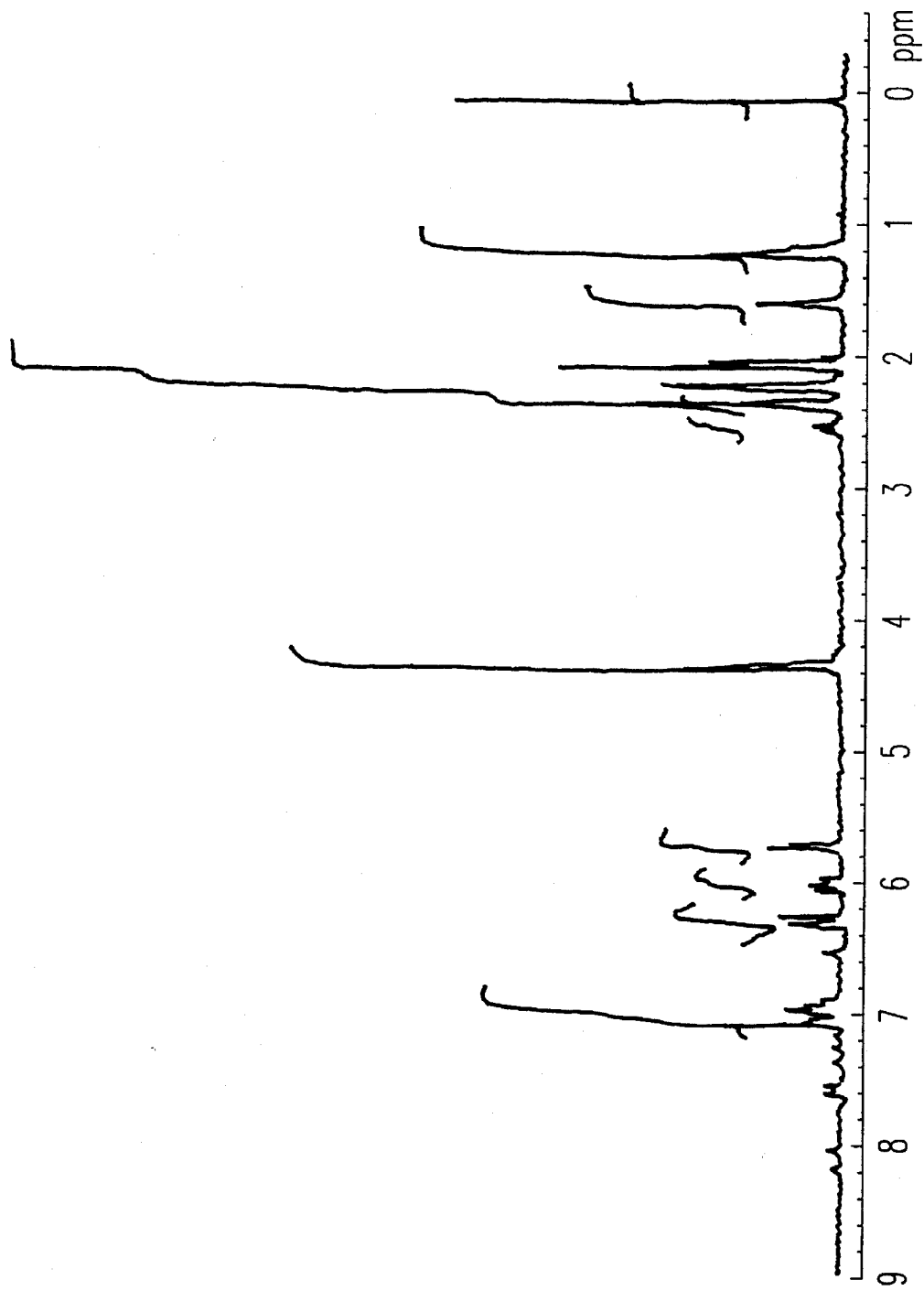
FIG. 3 is the NMR spectrum of the product obtained in Example II-2.
Figure 4:
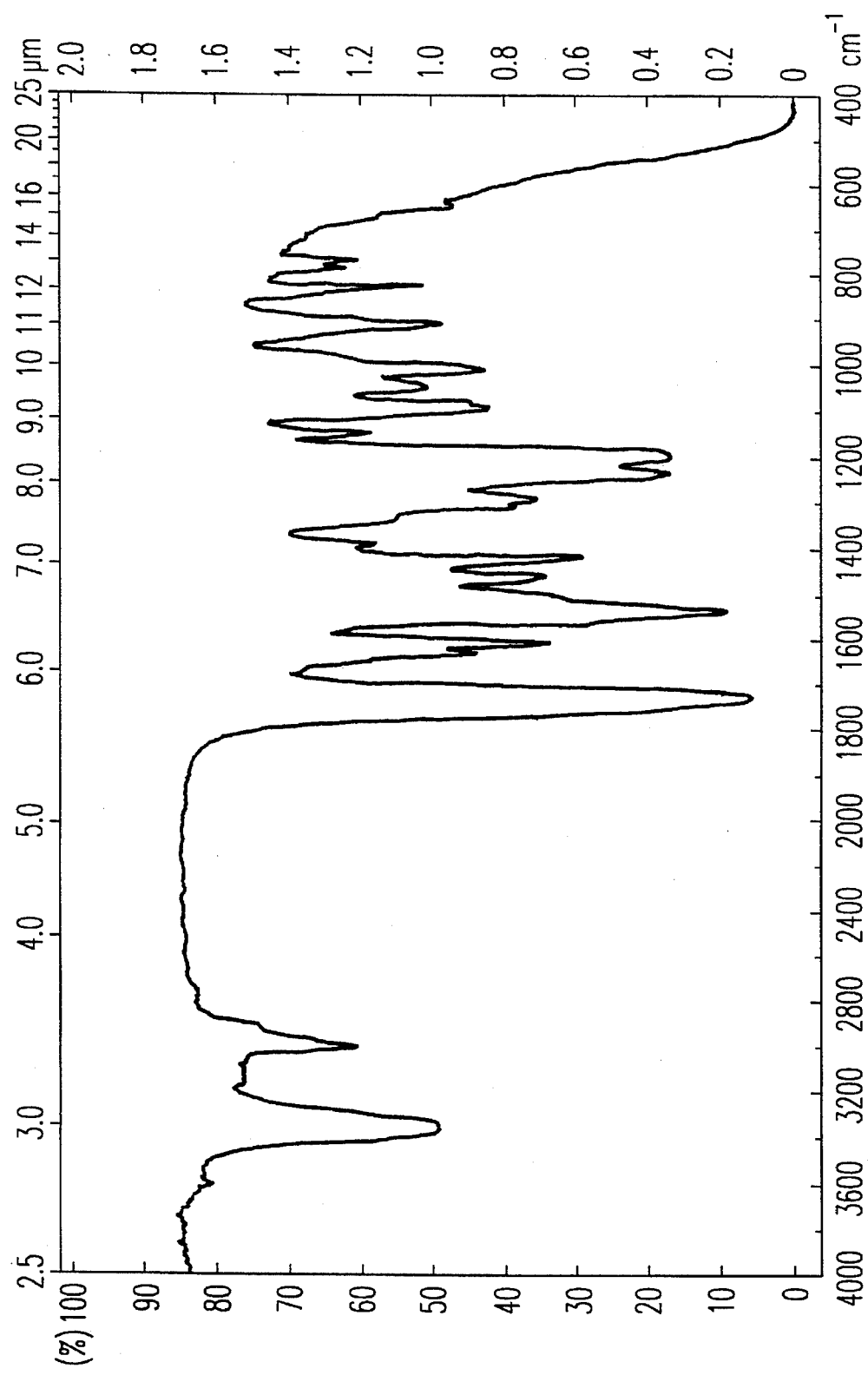
FIG. 4 is the IR spectrum of the product obtained in Example II-2.

In a three-necked flask equipped with a stirrer and a condenser were charged 100 parts of tolylene-2,4-diisocyanate, 50 parts of toluene, 50 parts of 2-Butanone Oxime, and 0.2 part of dibutyltin dilaurate, and the mixture was heated at 60° C. for 1.5 hours while stirring. To the mixture was added 66 parts of 2-hydroxyethyl acrylate at that temperature, and a reaction was conducted for 7 hours. After completion of the reaction, the solvent was removed by distillation to obtain a product (designated Compound, B). The NMR spectrum (in chloroform-d) and IR spectrum (edible salt plate method) of compound B are shown in FIGS. 3 and 4, respectively.

EXAMPLE II-3

Figure 5:
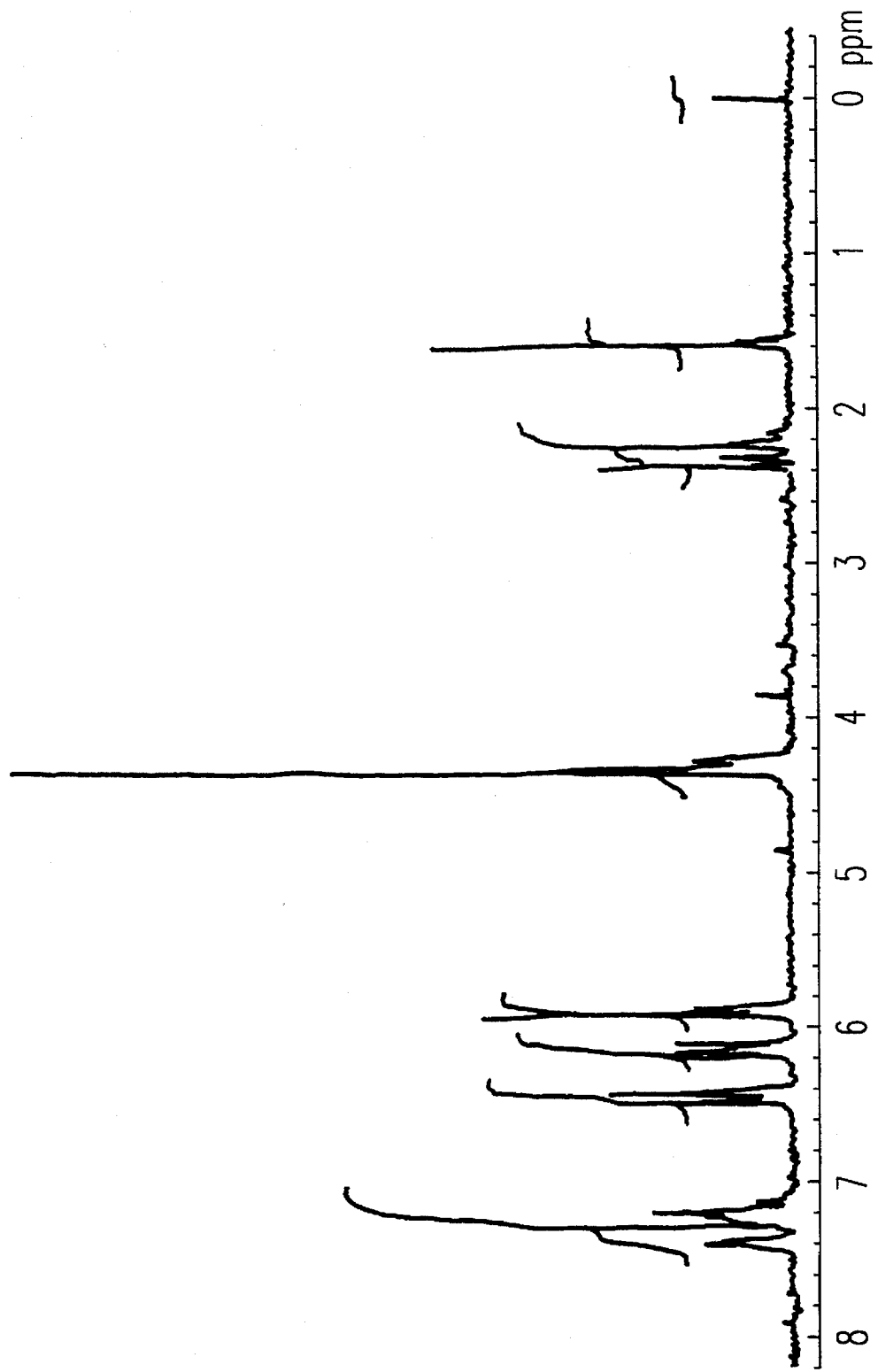
FIG. 5 is the NMR spectrum of the product obtained in Example II-3.
Figure 6:
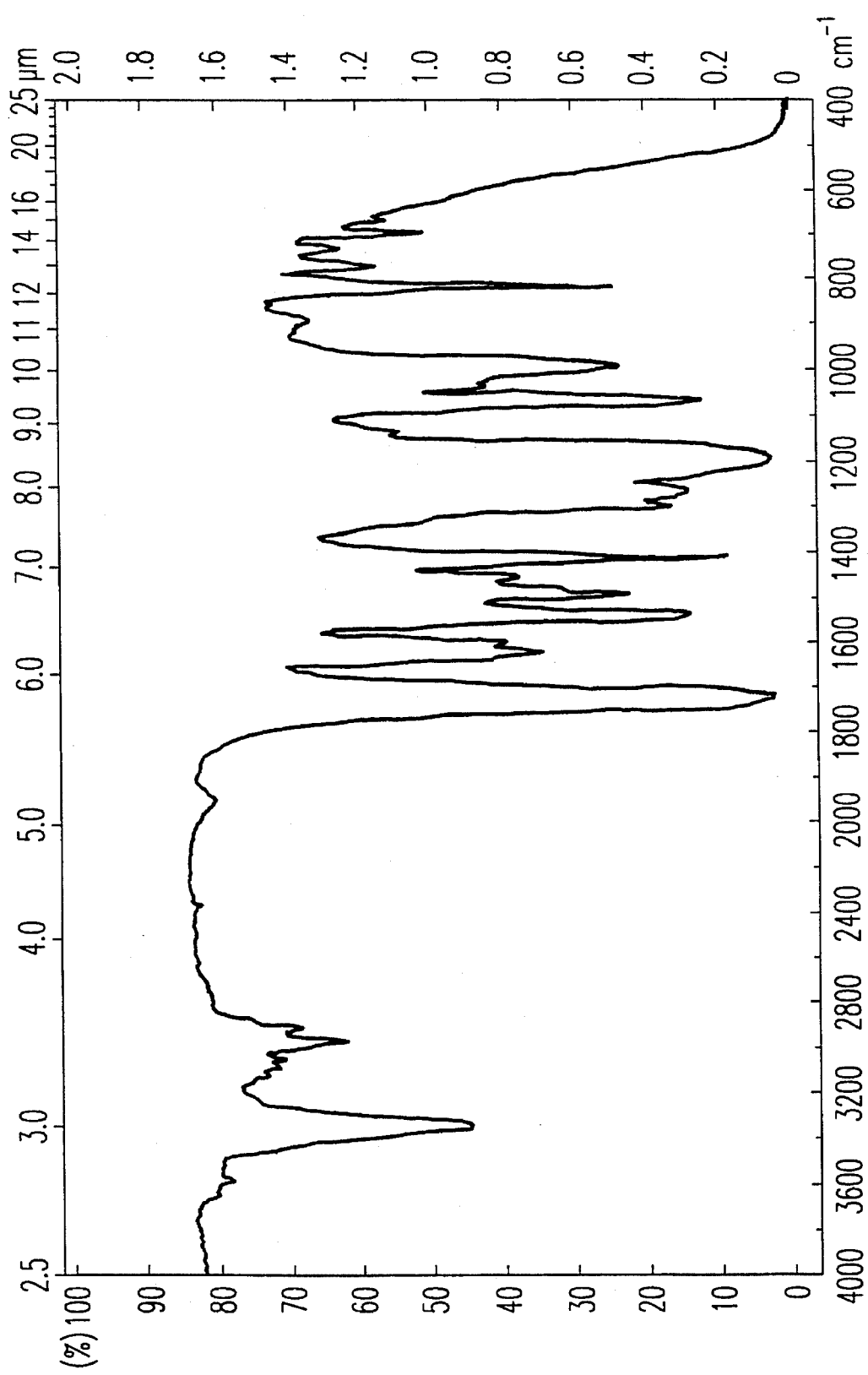
FIG. 6 is the IR spectrum of the product obtained in Example II-3.

In a three-necked flask equipped with a stirrer and a condenser were charged 100 parts of tolylene-2,4-diisocyanate, 50 parts of toluene, 53 parts of phenol, and 0.2 part of dibutyltin dilaurate, and the mixture was heated at 60° C. for 1.5 hours while stirring. To the mixture was added 170 parts of pentaerythritol triacrylate at that temperature, and a reaction was conducted for 24 hours. After completion of the reaction, the solvent was removed by distillation to obtain a product (designated Compound C). The NMR spectrum (in chloroform-d) and IR spectrum (edible salt plate) of the product are shown in FIGS. 5 and 6, respectively.

EXAMPLE II-4

Figure 7:
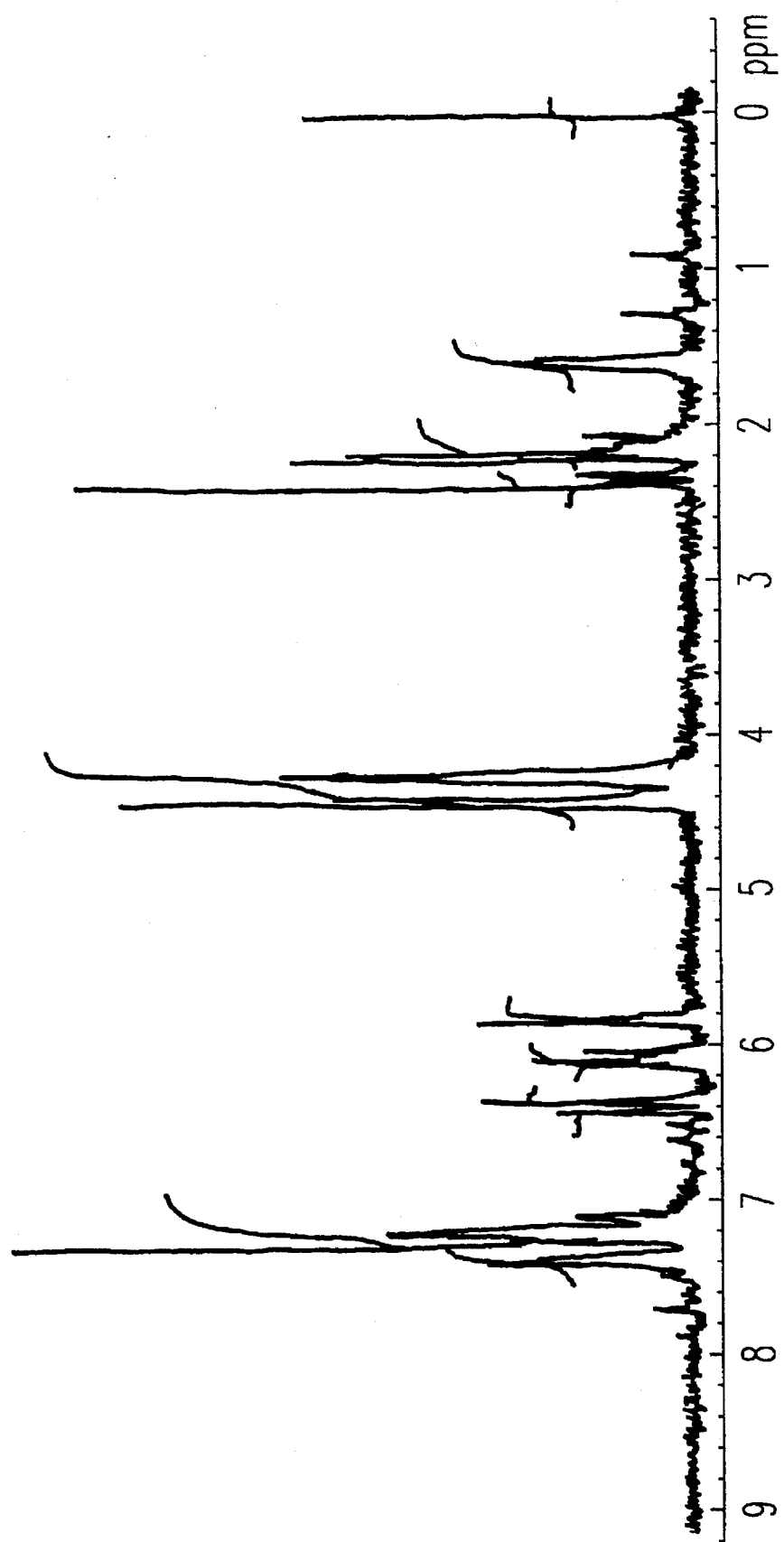
FIG. 7 is the NMR spectrum of the product obtained in Example II-4.
Figure 8:
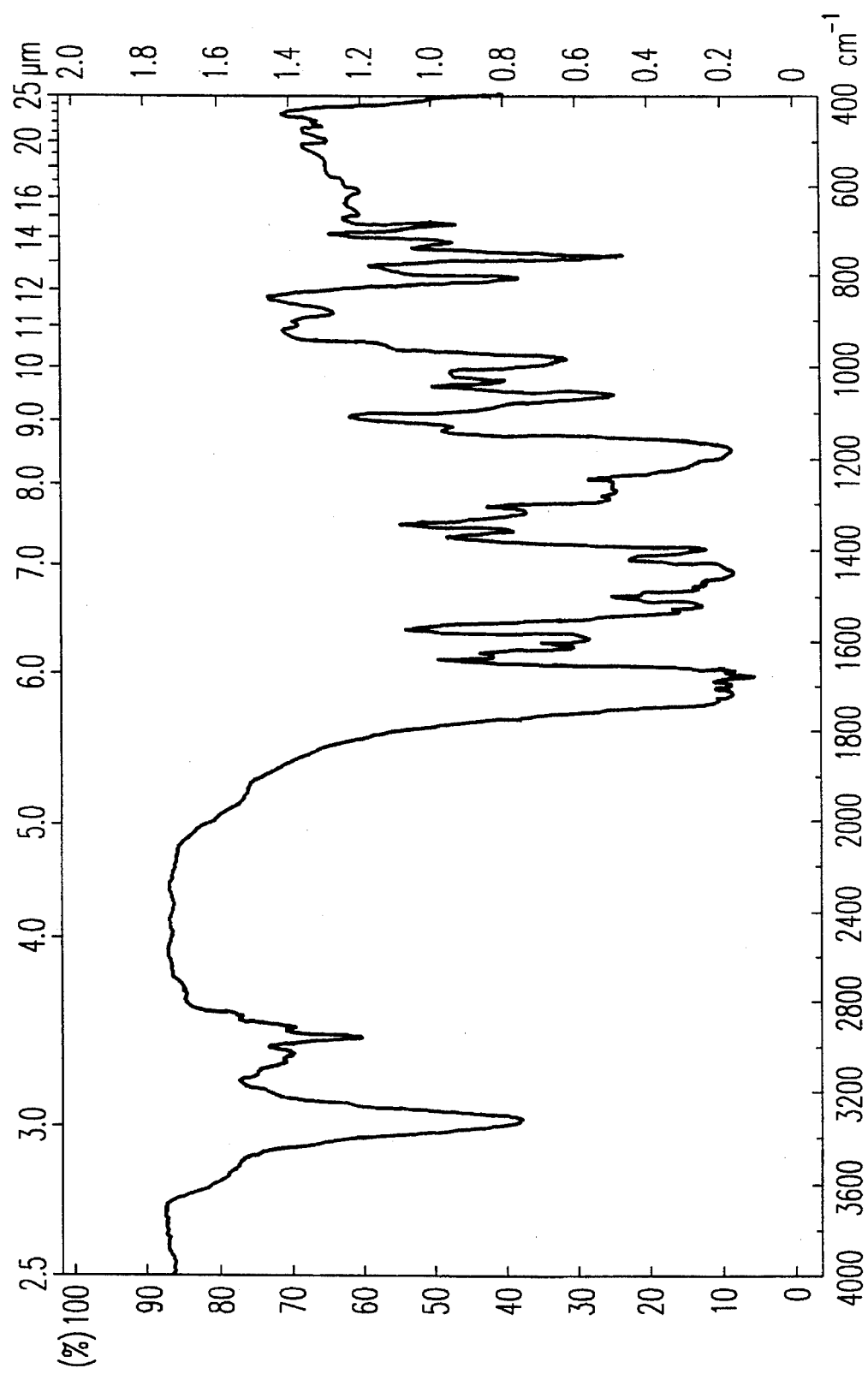
FIG. 8 is the IR spectrum of the product obtained in Example II-4.

In a three-necked flask equipped with a stirrer and a condenser were charged 100 parts of tolylene-2,4-diisocyanate, 50 parts of toluene, 53 parts of phenol, and 0.2 part of dibutyltin dilaurate, and the mixture was heated at 60° C. for 1.5 hours while stirring. To the mixture was added 209 parts of bis(acryloxyethyl)hydroxyethyl isocyanurate at that temperature, and a reaction was conducted for 24 hours. After completion of the reaction, the solvent was removed by distillation to obtain a product (designated Compound D). The NMR spectrum (in chloroform-d) and IR spectrum (KBr tablet) of compound D are shown in FIGS. 7 and 8, respectively.

EXAMPLE II-5

| | |
|---|---|
| Resin a-1 | 60 parts |
| Dipentaerythritol hexaacrylate | 5 parts |
| IRGACURE 907 | 5 parts |
| Compound A | 35 parts |
| Barium sulfate | 30 parts |
| Phthalocyanine Green | 2 parts |
| Flowlen AC-326F | 2 parts |
| Carbitol acetate | 3 parts |
| Solvent naphtha | 1 part |

The above components were preliminarily mixed and then kneaded three times in a three-roll mill to prepare a photosensitive heat-curing resin composition. The composition was screen-printed on the entire surface of a printed circuit board and dried in a circulating hot air oven at 80° C. for 20 minutes followed by cooling to room temperature to obtain a dried film. The film was exposed to light of a metal halide lamp (manufactured by Oak Seisakusho) through a patterned photomask in contact with the film. The exposed film was developed with a 1% sodium carbonate aqueous solution for 1 minute to remove the unexposed area, washed with water, and postcured in a circulating hot air oven set at 150° C. for 30 minutes to provide a solder resist pattern.

EXAMPLE II-6

| | |
|---|---|
| Resin a-1 | 60 parts |
| Dipentaerythritol hexaacrylate | 5 parts |
| IRGACURE 907 | 5 parts |
| Compound B | 50 parts |
| Amorphous silica | 30 parts |
| Phthalocyanine Green | 2 parts |
| Flowlen AC-326F | 2 parts |
| Carbitol acetate | 3 parts |
| Solvent naphtha | 1 part |

A solder resist pattern was formed on a printed circuit board in the same manner as in Example II-5, except for using the above components.

EXAMPLE II-7

| | |
|---|---|
| Resin a-1 | 60 parts |
| Dipentaerythritol hexaacrylate | 5 parts |
| IRGACURE 907 | 5 parts |
| Compound C | 20 parts |
| Barium sulfate | 15 parts |
| Amorphous silica | 15 parts |
| Phthalocyanine Green | 2 parts |
| Flowlen AC-326F | 2 parts |
| Carbitol acetate | 3 parts |
| Solvent naphtha | 1 part |

A solder resist pattern was formed on a printed circuit board in the same manner as in Example II-5, except for using the above components.

EXAMPLE II-8

| Resin a-1 | 60 parts |
| Dipentaerythritol hexaacrylate | 5 parts |
| IRGACURE 907 | 5 parts |
| Compound D | 35 parts |
| Barium sulfate | 15 parts |
| Amorphous silica | 15 parts |

-continued

| Phthalocyanine Green | 2 parts |
| Flowlen AC-326F | 2 parts |
| Carbitol acetate | 3 parts |
| Solvent naphtha | 1 part |

A solder resist pattern was formed on a printed circuit board in the same manner as in Example II-5, except for using the above components.

COMPARATIVE EXAMPLE II-1

| Resin a-1 | 60 parts |
| Dipentaerythritol hexaacrylate | 5 parts |
| IRGACURE 907 | 5 parts |
| Barium sulfate | 20 parts |
| Phthalocyanine Green | 2 parts |
| Flowlen AC-326F | 2 parts |
| Carbitol acetate | 3 parts |
| Solvent naphtha | 1 part |

A solder resist pattern was formed on a printed circuit board in the same manner as in Example II-5, except for using the above components.

COMPARATIVE EXAMPLE II-2

| Resin a-1 | 60 parts |
| Dipentaerythritol hexaacrylate | 5 parts |
| IRGACURE 907 | 5 parts |
| Epikote 157 | 35 parts |
| Dicyandiamide | 2 parts |
| Barium sulfate | 20 parts |
| Talc | 10 parts |
| Phthalocyanine Green | 2 parts |

-continued

| Flowlen AC-326F | 2 parts |
| Carbitol acetate | 3 parts |
| Solvent naphtha | 1 part |

A solder resist pattern was formed on a printed circuit board in the same manner as in Example II-5, except for using the above components.

The resin compositions and solder resist patterns obtained in Examples II-5 to II-8 and Comparative Examples II-1 and II-2 were tested in the same manner as in Example I-1. The results obtained are shown in Table II-1 below.

TABLE II-I

|  | Example II-5 | Example II-6 | Example II-7 | Example II-8 | Compar. Example II-1 | Compar. Example II-2 |
| --- | --- | --- | --- | --- | --- | --- |
| Photosensitivity | 6 | 6 | 7 | 6 | 5 | 4 |
| Developability | excellent | good | excellent | excellent | excellent | poor |
| Adhesion | excellent | excellent | excellent | excellent | good | excellent |
| Pencil Hardness | 4H | 4H | 4H | 4H | 4H | 4H |
| Resistance to Soldering | excellent | excellent | excellent | excellent | poor | excellent |
| Resistance to Ni Plating | excellent | excellent | excellent | excellent | very poor | poor |
| Insulation Resistance ($\Omega$): |  |  |  |  |  |  |
| Original state | $6 \times 10^{13}$ | $3 \times 10^{13}$ | $3 \times 10^{13}$ | $5 \times 10^{13}$ | $3 \times 10^{14}$ | $3 \times 10^{14}$ |
| After boiling | $3 \times 10^{12}$ | $2 \times 10^{12}$ | $3 \times 10^{12}$ | $6 \times 10^{12}$ | $2 \times 10^{11}$ | $6 \times 10^{12}$ |

As is apparent from the results of Table II-1, the photosensitive heat-curing resin composition according to the present invention is excellent in photosensitivity and developability and provides a solder resist pattern excellent in various characteristics such as adhesion, hardness, soldering resistance, and plating resistance. To the contrary, the comparative photosensitive heat-curing resin composition containing a photocurable oligomer as a sole curing component (Comparative Example II-1) or a combination of a photocurable oligomer and a heat-curing component (Comparative Example II-2) has difficulty in obtaining both of photosensitivity and developability before curing as well as various characteristics after curing.

As demonstrated above, the resin composition comprising compound (C) containing a polymerizable double bond and a blocked isocyanate group in combination with a photocurable oligomer is less susceptible to heat fog and exhibits improved developability as compared with the conventional techniques. Further, since the crosslinking density after exposure is not reduced, the coating film is hardly corroded during development and is therefore freed of reductions in sensitivity or resolution. Furthermore, crosslinking proceeds by heating subsequent to development to form a solder resist pattern excellent in adhesion, electrical insulating properties, soldering heat resistance, and plating resistance.

PREPARATION EXAMPLE III-1

In a three-necked flask equipped with a stirrer and a condenser were charged 1070 parts of a cresol-novolak epoxy resin having an epoxy equivalent of 214 ("EPICLON N-680" produced by Dainippon Ink Co., Ltd.), 620 parts of carbitol acetate, and 300 parts of solvent naphtha. The mixture was melted by heating to 90° C. while stirring. To the molten mixture were added 400 parts of acrylic acid, 1 part of hydroquinone, and 6.8 parts of dimethylbenzylamine, and the mixture was stirred at 110° C. for 24 hours. After cooling to 100° C., 370 parts of tetrahydrophthalic acid anhydride was added to the reaction mixture, followed by stirring for 4 hours to obtain a photocurable oligomer solution having an acid value of 50 mg-KOH/g (hereinafter designated Resin c-1).

PREPARATION EXAMPLE III-2

In a flask equipped with a stirrer, a condenser and a dropping funnel were charged 40 parts of carbitol acetate, 37 parts of tolylene 2,4-diisocyanate, and 0.05 part of dibutyltin dilaurate, and a mixture of 20 parts of phenol and 35 parts of carbitol acetate was added thereto dropwise at 60° C. over a period of 30 minutes, followed by stirring for 1 hour to allow the mixture to react. The resulting solution of a partially blocked isocyanate compound was added to 449 parts of Resin c-1 prepared in Preparation Example III-1, and the mixture was allowed to react at 65° C. for 6 hours to obtain a solution of a photocurable oligomer having incorporated thereinto a blocked isocyanate group (designated Resin c-2).

PREPARATION EXAMPLE III-3

In a flask equipped with a stirrer, a condenser, and a dropping funnel were charged 40 parts of carbitol acetate, 47 parts of isophorone diisocyanate, and 0.05 part of dibutyltin dilaurate, and a mixture of 20 parts of phenol and 35 parts of carbitol acetate was added thereto dropwise at 60° C. over a period of 30 minutes, followed by stirring for 1 hour to allow the mixture to react. The resulting solution of a partially blocked isocyanate compound was added to 460 parts of Resin a-1 prepared in Preparation Example I-1, and the mixture was allowed to react at 65° C. for 6 hours to obtain a solution of a photocurable oligomer having incorporated thereinto a blocked isocyanate group (designated Resin c-3).

PREPARATION EXAMPLE III-4

In a three-necked flask equipped with a stirrer and a condenser were charged 1030 parts of a bisphenol A novolak epoxy resin having an epoxy equivalent of 206 ("EPIKOTE 157"), 600 parts of carbitol acetate, and 300 parts of solvent naphtha. The mixture was melted by heating to 90° C. while stirring. To the molten mixture were added 400 parts of acrylic acid, 1 part of hydroquinone, and 6.8 parts of dimethylbenzylamine, and the mixture was stirred at 110° C. for 24 hours. After cooling to 100° C., 230 parts of succinic anhydride was added to the reaction mixture, followed by stirring for 4 hours to obtain a photocurable oligomer solution having an acid value of 59 mg-KOH/g (hereinafter designated Resin c-4).

PREPARATION EXAMPLE III-5

A partially blocked isocyanate compound solution prepared in the same manner as in Preparation Example III-2 was added to 449 parts of Resin c-4, and the mixture was allowed to react at 65° C. for 6 hours to obtain a solution of a photocurable oligomer having incorporated thereinto a blocked isocyanate (designated Resin c-5).

EXAMPLE III-1

| | |
|---|---|
| Resin c-2 | 55 parts |
| Dipentaerythritol hexaacrylate | 10 parts |
| IRGACURE 907 | 5 parts |
| Diethylthioxanthone | 1 part |
| Dicyandiamide | 1 part |
| Barium sulfate | 15 parts |
| Silica | 8 parts |
| Aerosil | 1 part |
| Phthalocyanine Green | 1 part |
| Flowlen AC-326F | 1 part |
| Solvent naphtha | 2 parts |

The above components were preliminarily mixed and then kneaded three times in a three-roll mill to prepare a photosensitive heat-curing resin composition. The composition was screen-printed on the entire surface of a printed circuit board and dried in a circulating hot air oven at 80° C. for 20 minutes followed by cooling to room temperature to obtain a dried film. The film was exposed to light of a metal halide lamp (manufactured by Oak Seisakusho) through a patterned photomask in contact with the film. The exposed film was developed with a 1% sodium carbonate aqueous solution for 1 minute to remove the unexposed area, washed with water, and postcured in a circulating hot air oven set at 150° C. for 30 minutes to provide a solder resist pattern.

EXAMPLE III-2

| | |
|---|---|
| Resin c-3 | 60 parts |
| Dipentaerythritol hexaacrylate | 5 parts |
| IRGACURE 907 | 5 parts |
| Dicyandiamide | 1 part |
| Barium sulfate | 20 parts |
| Phthalocyanine Green | 2 parts |
| Flowlen AC-326F | 2 parts |
| Carbitol acetate | 3 parts |
| Solvent naphtha | 2 parts |

A solder resist pattern was formed on a printed circuit board in the same manner as in Example III-1, except for using the above components.

EXAMPLE III-3

| | |
|---|---|
| Resin c-5 | 55 parts |
| Dipentaerythritol hexaacrylate | 5 parts |
| IRGACURE 907 | 5 parts |
| Dicyandiamide | 1 part |
| Barium sulfate | 25 parts |
| Phthalocyanine Green | 2 parts |
| Flowlen AC-326F | 2 parts |
| Carbitol acetate | 3 parts |
| Solvent naphtha | 2 parts |

A solder resist pattern was formed on a printed circuit board in the same manner as in Example III-1, except for using the above components.

COMPARATIVE EXAMPLE III-1

| | |
|---|---|
| Resin c-1 | 55 parts |
| Dipentaerythritol hexaacrylate | 10 parts |
| IRGACURE 907 | 5 parts |
| Diethylthioxanthone | 1 part |
| Dicyandiamide | 1 part |
| Barium sulfate | 15 parts |
| Silica | 8 parts |
| Aerosil | 1 part |
| Phthalocyanine Green | 1 part |

-continued

| | |
|---|---|
| Flowlen AC-326F | 1 part |
| Solvent naphtha | 2 parts |

A solder resist pattern was formed on a printed circuit board in the same manner as in Example III-1, except for using the above components.

COMPARATIVE EXAMPLE III-2

| | |
|---|---|
| Resin c-1 | 60 parts |
| Dipentaerythritol hexaacrylate | 5 parts |
| IRGACURE 907 | 5 parts |
| Epiclon N-680 | 35 parts |
| Dicyandiamide | 2 parts |
| Barium sulfate | 30 parts |
| Phthalocyanine Green | 2 parts |
| Flowlen AC-326F | 2 parts |
| Carbitol acetate | 3 parts |
| Solvent naphtha | 1 part |

A solder resist pattern was formed on a printed circuit board in the same manner as in Example III-1, except for using the above components.

The solder resist resin compositions prepared in Examples III-1 to III-4 and Comparative Examples III-1 and III-2 and the solder resist patterns formed by using these compositions were tested according to the following test methods. The results obtained are shown in Table III-1 below.

1) Tack-Free Properties

A finger was pressed onto the printed and dried film, and the state of the film surface was evaluated according to the following standard.

Good—No tack was observed at all.

Medium—The fingerprint was slightly left on the surface.

Poor—The fingerprint was markedly left on the surface.

2) Developability

The printed and dried film was exposed to 500 mJ/cm$^2$ of ultraviolet light through a patterned photomask. The exposed sample was immersed in the developer for 1 minute with stirring, and the state of removal of the unexposed area was observed with the naked eye and evaluated according to the following standard.

Excellent—The unexposed area was removed completely.

Good—Thin undeveloped film remained on some areas.

Poor—Non-development of the unexposed area was observed all over the surface.

Very poor—The unexposed area substantially remained undeveloped.

3) Adhesion

The printed and dried film was exposed to ultraviolet light adjusted to 500 mJ/cm$^2$ with an integrating actinometer (manufactured by Oak Seisakusho) through a photomask, and the exposed film was immersed in the developer for 1 minute with stirring. The developed film was postcured at 150° C. for 30 minutes to obtain a test piece. The test piece was crosscut and subjected to peel test using cellophane tape in accordance with JIS D0202. The adhesion of the film was evaluated from the number of squares remaining on the substrate per 100 squares according to the following standard.

Excellent—100/100

Good—100/100 (provided that the crosscut portion was slightly peeled off)

Medium—50/100 to 99/100

Poor—0/100 to 49/100

4) Pencil Hardness

Film hardness of the same test piece as prepared in the adhesion test was measured according to JIS K5400.

5) Resistance to Soldering

In accordance with JIS C6481, the same test piece as used in the adhesion test was dipped in a soldering bath at 260° C. for 15 seconds three times. The state of the resist film was observed and evaluated as a whole according to the following standard.

Good—No change was observed.

Poor—Remarkable change was observed.

Very poor—Blistering or falling of the film due to blisters was observed.

6) Resistance to Nickel Plating

The test piece as used in the adhesion test was plated with an electroless nickel plating solution "ICP Nicolon" at a bath temperature of 85° C. for 30 minutes. The state of the resist film was evaluated according to the same standard as in 5) above.

7) Insulation Resistance

A test piece was prepared in the same manner as in the adhesion test, except for using a G-10 comb type test pattern specified in JIS Z3197 as a photomask. A voltage of 100 V was applied for 1 minutes to the test piece immediately after the preparation (original stage) or after being boiled for 2 hours, and then the insulation resistance was measured.

8) Pot Life

The photosensitive heat-curing resin composition prepared was sealed in a bottle and preserved in a thermostat set at 25° C. The above-described test of developability was conducted with time, and the time until a reduction in developability occurred was taken as a pot life.

TABLE III-1

| | Example III-1 | Example III-2 | Example III-3 | Compar. Example III-1 | Compar. Example III-2 |
|---|---|---|---|---|---|
| Tack-Free Properties | good | good | good | medium | medium |
| Developability | excellent | excellent | excellent | excellent | poor |
| Adhesion | excellent | excellent | excellent | excellent | excellent |
| Pencil Hardness | 4H | 4H | 4H | 4H | 4H |

TABLE III-1-continued

| | Example III-1 | Example III-2 | Example III-3 | Compar. Example III-1 | Compar. Example III-2 |
|---|---|---|---|---|---|
| Resistance to Soldering | good | good | good | very poor | good |
| Resistance to Ni Plating | good | good | good | very poor | good |
| Insulation Resistance ($\Omega$): | | | | | |
| Original state | $6 \times 10^{13}$ | $2 \times 10^{14}$ | $8 \times 10^{14}$ | $4 \times 10^{13}$ | $3 \times 10^{14}$ |
| After boiling | $2 \times 10^{12}$ | $5 \times 10^{12}$ | $6 \times 10^{11}$ | $2 \times 10^{11}$ | $6 \times 10^{12}$ |
| Pot Life (day) | >30 | >30 | >30 | >30 | 4 |

As is apparent from the results of Table III-1, the photosolder resist composition according to the present invention is excellent in tack-free properties and developability and provides a solder resist pattern excellent in various characteristics such as adhesion, hardness, soldering resistance, and plating resistance. In addition, the composition of the present invention has a long pot life. To the contrary, the composition containing a photocurable oligomer containing no blocked isocyanate group as in Comparative Example III-1 does not have sufficient performance properties for practical use, and the composition having incorporated therein an epoxy resin for improving coating film properties as in Comparative Example III-2 has too short a pot life to be used as a one-pack type composition.

As demonstrated above, the photosensitive resin composition according to the third embodiment of the present invention is a one-pack type solder resist composition which exhibits excellent developability and provides a solder resist pattern excellent in adhesion, electrical insulating properties, soldering resistance, and plating resistance.

While the invention has been described in detail and with reference to specific examples thereof, it will be apparent to one skilled in the art that various changes and modifications can be made therein without departing from the spirit and scope thereof.

What is claimed is:

1. A photosolder resist composition consisting essentially of (A-1) a photocurable oligomer containing at least two polymerizable double bonds and an acidic functional group, and (B) a compound containing one polymerizable double bond and one epoxy group in the molecule.

2. The photosolder resist composition as claimed in claim 1, wherein said acidic functional group in the component (A-1) is a carboxyl group.

* * * * *